(12) United States Patent
Tasher et al.

(10) Patent No.: US 9,397,663 B2
(45) Date of Patent: Jul. 19, 2016

(54) FAULT PROTECTION FOR HIGH-FANOUT SIGNAL DISTRIBUTION CIRCUITRY

(71) Applicant: Winbond Electronics Corporation, Zhubei (TW)

(72) Inventors: Nir Tasher, Tel Mond (IL); Valery Teper, Petach Tikva (IL); Leonid Azriel, Haifa (IL)

(73) Assignee: WINBOND ELECTRONICS CORPORATION, Taichung (TW)

( * ) Notice: Subject to any disclaimer, the term of this patent is extended or adjusted under 35 U.S.C. 154(b) by 0 days.

(21) Appl. No.: 14/752,944

(22) Filed: Jun. 28, 2015

(65) Prior Publication Data

US 2016/0028394 A1 Jan. 28, 2016

Related U.S. Application Data

(63) Continuation-in-part of application No. 14/337,257, filed on Jul. 22, 2014.

(51) Int. Cl.
*H03K 19/00* (2006.01)
*H03K 19/003* (2006.01)
*G01R 31/28* (2006.01)
(Continued)

(52) U.S. Cl.
CPC .......... *H03K 19/003* (2013.01); *G01R 31/2843* (2013.01); *G01R 31/31719* (2013.01); *G06K 19/07309* (2013.01); *H03K 3/037* (2013.01); *H03K 3/0375* (2013.01)

(58) Field of Classification Search
CPC ..................... G01R 31/31719; G01R 31/3016; G01R 31/318536; G01R 31/318552; G06F 1/10; G06F 1/04; G06F 12/14; G06F 11/181; H03K 19/003; H03K 5/135; H03K 19/17764; H03K 2217/94116; H03K 3/02335; H03K 3/0375; H03K 3/037; H03K 19/17768; H03K 3/013; H03L 7/085
See application file for complete search history.

(56) References Cited

U.S. PATENT DOCUMENTS 4,860,288 A 8/1989 Teske et al.
5,867,409 A * 2/1999 Nozuyama .............. G06F 7/584
377/72
(Continued)

FOREIGN PATENT DOCUMENTS

CN 101192820 A 6/2010

OTHER PUBLICATIONS

TW Application # 103140005 Office Action dated Nov. 25, 2015.
(Continued)

*Primary Examiner* — Vibol Tan
(74) *Attorney, Agent, or Firm* — D.Kligler IP Services Ltd.

(57) ABSTRACT

An Integrated Circuit (IC) includes signal distribution circuitry and protection circuitry. The signal distribution circuitry is configured to distribute a high-fanout signal across the IC. The protection circuitry includes a plurality of logic stages and detection circuitry. The logic stages are configured to receive multiple instances of the signal that are sampled at multiple sampling points in the signal distribution circuitry. The logic stages are interconnected to drive one another in accordance with a given topology so as to propagate abnormalities indicative of faults occurring in the signal distribution circuitry. The detection circuitry is configured to detect a fault in the signal distribution circuitry in response to an abnormality propagating in the plurality of logic stages.

18 Claims, 4 Drawing Sheets

(51) Int. Cl.
*G01R 31/317* (2006.01)
*G06K 19/073* (2006.01)
*H03K 3/037* (2006.01)

(56) References Cited

U.S. PATENT DOCUMENTS

| | | | | |
|---|---|---|---|---|
| 6,735,732 | B2* | 5/2004 | Yamada | G06F 1/12 |
| | | | | 326/93 |
| 6,844,761 | B2* | 1/2005 | Byun | H03L 7/0812 |
| | | | | 327/149 |
| 7,372,304 | B2* | 5/2008 | Fruhauf | G01R 31/31719 |
| | | | | 326/38 |
| 7,702,992 | B2 | 4/2010 | Ogawa | |
| 7,770,049 | B1 | 8/2010 | Searles et al. | |
| 8,542,177 | B2* | 9/2013 | Lee | G09G 3/3688 |
| | | | | 345/99 |
| 2008/0284483 | A1 | 11/2008 | Nakashima | |
| 2010/0090992 | A1* | 4/2010 | Lee | G09G 3/3688 |
| | | | | 345/204 |
| 2013/0099844 | A1 | 4/2013 | Kawaoka | |
| 2013/0113572 | A1* | 5/2013 | Sharda | G06F 1/04 |
| | | | | 331/34 |
| 2013/0305078 | A1 | 11/2013 | Lee et al. | |
| 2014/0075255 | A1 | 3/2014 | Lee et al. | |
| 2014/0219406 | A1 | 8/2014 | Chen et al. | |
| 2015/0121327 | A1 | 4/2015 | Kamal et al. | |
| 2015/0269298 | A1 | 9/2015 | Dai et al. | |
| 2015/0280722 | A1 | 10/2015 | Liu et al. | |
| 2015/0323959 | A1 | 11/2015 | Arabi | |

OTHER PUBLICATIONS

European Application # 14179703.5 Search Report dated Feb. 13, 2015.

U.S. Appl. No. 14/337,257 Office Action dated Feb. 22, 2016.

* cited by examiner

FAULT PROTECTION FOR HIGH-FANOUT SIGNAL DISTRIBUTION CIRCUITRY

CROSS-REFERENCE TO RELATED APPLICATIONS

This application is a continuation-in-part of U.S. patent application Ser. No. 14/337,257, filed Jul. 22, 2014, whose disclosure is incorporated herein by reference.

FIELD OF THE INVENTION

The present invention relates generally to digital electronic circuitry, and particularly to methods and systems for protection from faults in high-fanout signal distribution circuitry.

BACKGROUND OF THE INVENTION

Various techniques are used for illegitimately accessing, analyzing or extracting information from secure electronic circuitry, such as cryptographic circuitry. Some attacks, referred to as fault injection, typically involve causing a fault in the circuit, e.g., by physically contacting or damaging signal lines, by applying high-power laser or electromagnetic pulses, or by causing glitches on power supply or other external interfaces. The fault is expected to cause the circuit to output sensitive information, or otherwise assist the attacker in penetrating the circuit or the information it stores.

SUMMARY OF THE INVENTION

An embodiment of the present invention that is described herein provides an Integrated Circuit (IC) including signal distribution circuitry and protection circuitry. The signal distribution circuitry is configured to distribute a high-fanout signal across the IC. The protection circuitry includes a plurality of logic stages and detection circuitry. The logic stages are configured to receive multiple instances of the signal that are sampled at multiple sampling points in the signal distribution circuitry. The logic stages are interconnected to drive one another in accordance with a given topology so as to propagate abnormalities indicative of faults occurring in the signal distribution circuitry. The detection circuitry is configured to detect a fault in the signal distribution circuitry in response to an abnormality propagating in the plurality of logic stages.

In some embodiments, the logic stages are configured to be clocked by respective instances of the signal. Additionally or alternatively, the logic stages may be configured to be set or reset by the multiple instances of the signal. In an embodiment, at least two successive logic stages in the topology are configured to be set or reset by the same instance of the signal.

In a disclosed embodiment, the logic stages are connected in a cascade. In an example embodiment, the cascade is cyclic. In another embodiment, the logic stages are connected in a tree or mesh topology. In various embodiments, the signal may include a clock signal, a reset signal and/or a test scan shift enable signal.

In some embodiments, the plurality of logic stages is configured to output an alternating pattern of logical values, and the detection circuitry is configured to detect the fault by identifying a deviation from the alternating pattern. In alternative embodiments, the logic stages are configured to alternate between logical values and to all output the same logical value at a given time, and the detection circuitry is configured to detect the fault by identifying a deviation from the same logical value.

In an embodiment, the detection circuitry is configured to disregard abnormalities that occur within a predefined interval after initialization. in another embodiment, the protection circuitry is configured to initialize the logic stages so as to initially produce an expected output. In yet another embodiment, in response to detecting the fault, the protection circuitry is configured to issue an alert or act upon the detected fault.

There is additionally provided, in accordance with an embodiment of the present invention, a method including distributing a high-fanout signal across an Integrated Circuit (IC) using signal distribution circuitry. Multiple instances of the signal are sampled at multiple respective sampling points in the signal distribution circuitry. The multiple instances of the signal are applied to a plurality of logic stages that are interconnected to drive one another in accordance with a given topology, so as to propagate abnormalities indicative of faults occurring in the signal distribution circuitry. A fault in the signal distribution circuitry is detected in response to an abnormality propagating in the plurality of logic stages.

The present invention will be more fully understood from the following detailed description of the embodiments thereof, taken together with the drawings in which:

DETAILED DESCRIPTION OF EMBODIMENTS

Overview

Figure 1:
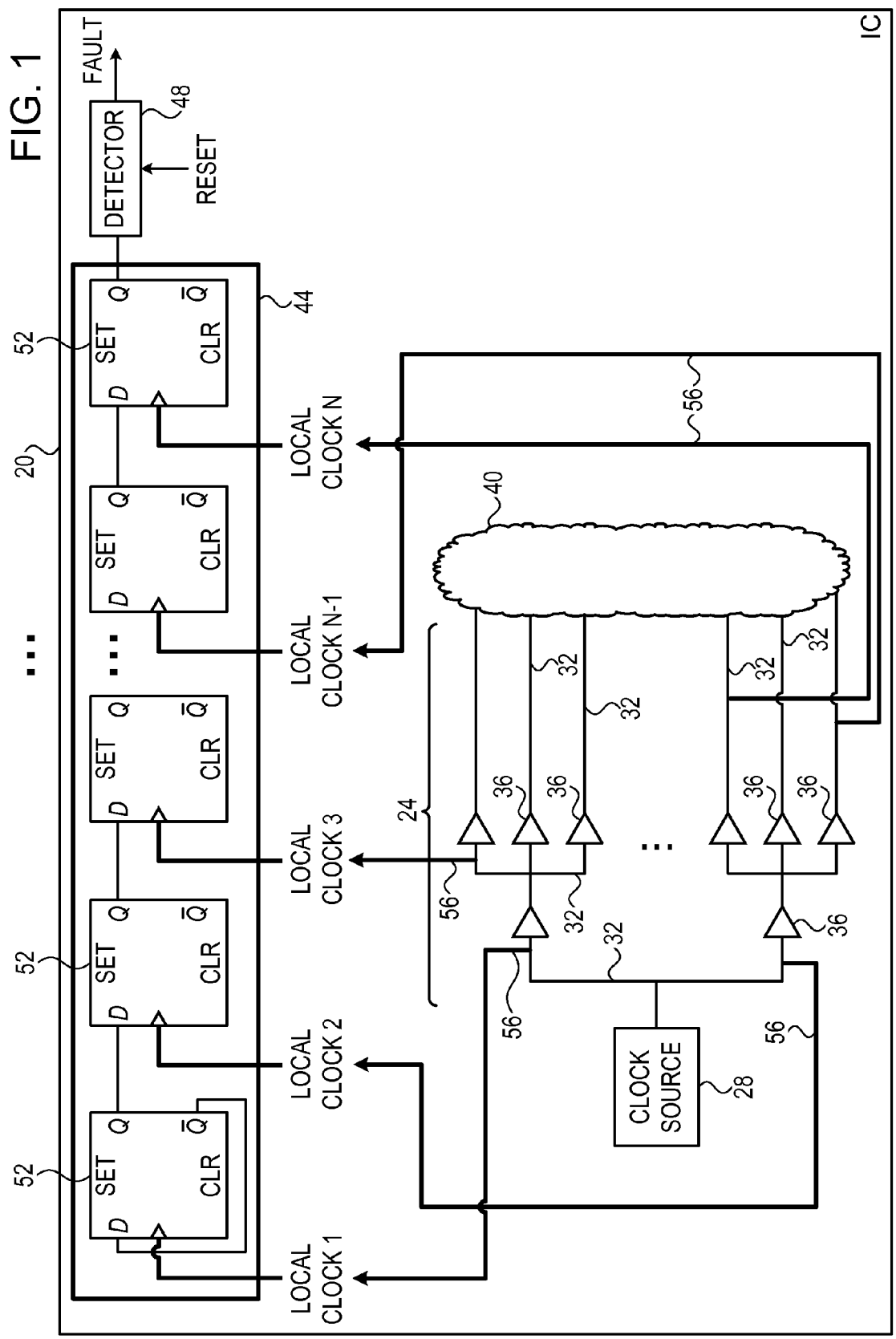
FIG. 1 is a block diagram that schematically illustrates an Integrated Circuit (IC) comprising clock-tree protection circuitry, in accordance with an embodiment of the present invention.

Embodiments that are described herein provide improved methods and systems for detecting faults in circuitry that distributes high-fanout signals in Integrated Circuits (ICs). Examples of high-fanout signals include clock signals, reset signals and test scan shift enable signals.

In the disclosed embodiments, an IC comprises signal distribution circuitry that distributes a high-fanout signal from a source to various hardware units across the IC. The signal distribution circuitry typically comprises circuit traces that span large portions of the IC, as well as active components such as buffers and/or inverters.

In some cases, the signal distribution circuitry may be subject to fault attacks that attempt to analyze the IC functionality or gain access to information stored in the IC, for example. A fault attack typically applies some constant or temporary abnormality in the signal distribution circuitry, in an attempt to force the IC into an abnormal state that evades its protection mechanisms. Although the description that follows focuses on fault attacks, the disclosed techniques can also be used for detecting faults that are not caused by attacks.

In some embodiments, the IC comprises protection circuitry that detects, alerts and possibly acts upon fault attacks on the signal distribution circuitry. The protection circuitry comprises multiple logic stages that are configured to receive multiple instances of the high-fanout signal that are sampled at multiple sampling points in the signal distribution circuitry.

The logic stages (also referred to as cells) are interconnected in accordance with a given topology, e.g., a cascade, a tree or a mesh network. The logic stages drive one another in the given topology, output-to-input, so as to propagate abnormalities indicative of faults occurring in the signal distribution circuitry. The protection circuitry detects a fault in the signal distribution circuitry in response to an abnormality propagating via the logic stages. The embodiments described herein refer mainly to cascaded (possibly cyclically cascaded) logic stages, but the disclosed techniques can be implemented using various other suitable interconnection topologies.

Several example configurations of protection circuitry are described herein. In one embodiment, the high-fanout signal comprises a clock signal, and the signal distribution circuitry is referred to as a clock tree. The cascaded logic stages comprise respective Flip-Flops (FFs) that are clocked by multiple instances of the clock signal sampled at multiple sampling points on the clock tree.

The first logic stage in this embodiment has its negated output fed-back to its input. Under normal conditions, the output of the first logic stage (and thus, after a certain delay, the output of the cascade) is an alternating "1010101010 . . . " pattern. Any deviation from this pattern indicates an abnormality in one or more of the clock inputs of the FF stages, i.e., in one or more of the sampled instances of the clock signal. Such an abnormality propagates from one logic stage to the next, until reaching the output of the cascade. The processing circuitry comprises a detector, which detects faults in the clock tree by identifying deviations from the expected "101010 . . . " pattern at the cascade output. In alternative embodiments, other suitable patterns (e.g., a pseudo-random yet predictable pattern) can also be used.

In another embodiment, the high-fanout signal comprises a reset signal, and the signal distribution circuitry is referred to as a reset tree. The FFs in the cascaded logic stages are set or reset by multiple instances of the reset signal that are sampled at multiple sampling points on the clock tree. As in the previous embodiment, the cascade is expected to output an alternating "1010101010 . . . " pattern. A fault on the reset tree typically propagates and causes a deviation from the expected output that is detected by the detector.

In yet another embodiment, the protection circuitry comprises a cyclic cascade of logic cells. Each cell comprises a FF that is driven by the output of the previous cell and provides its negated output as input to the next cell. The FFs are initialized at reset, from which point they all hold the same value at any given time. The logic value alternates between "1" and "0" on every clock cycle. The FFs may be clocked by instances of the clock signal in order to protect the clock tree, and/or reset by instances of the reset signal in order to protect the reset tree. A fault is detected if not all the cells hold the same value, for example if a successive pair of cells is found to hold different values.

The disclosed techniques are highly effective and sensitive in detecting various kinds of fault attacks on distribution circuitry of high-fanout signals. At the same time, the protection circuitry is small and simple to implement.

Clock-Tree Fault Protection

FIG. 1 is a block diagram that schematically illustrates an Integrated Circuit (IC) 20 comprising clock-tree protection circuitry, in accordance with an embodiment of the present invention. IC 20 may comprise, for example, a microprocessor, a memory device, a custom Application-Specific IC (ASIC), a Field-Programmable Gate Array (FPGA) or any other suitable type of IC.

IC 20 comprises a clock tree 24, which distributes a clock signal from a clock source 28 to functional hardware 40 across the IC. Clock tree 24 comprises conductive traces 32, as well as active components 36 such as buffers and/or inverters. Hardware 40 may comprise any suitable number and types of functional units, which are distributed over the area of IC 20 as desired. As such, clock tree 24 may span large portions of the IC area, or even the entire IC.

The beginning of the clock tree, at the clock source, is referred to as a root. From the root toward the functional hardware, the clock-tree circuitry splits into multiple branches. The edges of the branches, which drive the functional hardware, are referred to as leaves.

The example of FIG. 1 refers to a single clock signal and a single clock tree, for the sake of clarity. Real-life ICs often contain multiple clock trees that distribute multiple clock signals. The disclosed techniques are similarly applicable in such ICs, as well.

In some embodiments, IC 20 further comprises protection circuitry for detecting faults in the clock tree, such as faults caused by hostile fault attacks. Such an attack may comprise, for example, cutting the clock tree at one or more points, injecting a voltage glitch at some point or points on the clock tree, forcing a fixed voltage or ground at some point or points on the clock tree, or any other kind of manipulation or abnormality.

In the present example, the protection circuitry of IC 20 comprises a shift register 44, which comprises multiple cascaded Flip-Flop (FF) stages 52, and a detector 48, also referred to as detection circuitry. Multiple sampling lines 56 extract multiple instances of the clock signal from multiple respective sampling points across clock tree 24. The multiple instances of the clock signal are routed to shift register 44 and drive respective clock inputs of FF stages 52. The number of FF stages, and the number of clock-signal instances, is denoted N.

In other words, each FF stage 52 is clocked by a respective instance of the clock signal, which is extracted from a respective sampling point on clock tree 24. Instances of the clock signal may be sampled at the root, at the leaves, or at any intermediate branch of the clock tree. The number and locations of the sampling points may be chosen as desired, for example at random or to protect specific hardware units or functions in the IC.

The first FF stage in the shift register (the left-most stage in the figure) has its negated ($\overline{Q}$) output fed-back to its input (D). The output (Q) of each FF stage drives the input (D) of the next stage, and the output of the last FF stage serves as output of the cascade.

Under normal steady-state conditions, the signal at the output of the cascade alternates between "1" and "0" at the rate of the clock signal. Steady-state conditions are typically reached N clock cycles after reset or initialization, since the initial states of the FF stages are unpredictable, and N cycles are needed for the alternating "1010101010 . . . " pattern to propagate to the output. In an alternative embodiment, the initial states of FF stages 52 can be set at system initialization to known values that already correspond to the expected pattern. In the present example, even-order FF stages may be reset to logic '0' and odd-order FF stages may be reset to logic '1'.

If a fault occurs at some point or points in the clock tree, e.g., as a result of an attack, one or more of the clock signal instances will exhibit some abnormality. For example, one or more clock signal instances may be shut-off (possibly indicating that the clock tree was cut), one or more clock signal instances may be stuck at some fixed voltage or ground, or a transient glitch may be found on one or more clock signal instances. Alternatively, any other suitable abnormality may show on one or more clock signal instances.

An abnormality in a given instance of the clock signal causes abnormality in clocking the respective FF stage 52 in the protection circuitry. As a result, the output of shift register 44 will deviate from the expected "10101010 . . . " pattern.

In some embodiments, detector 48 monitors the output of shift register 44 and checks for deviations from the expected "10101010 . . . " pattern. The detector is typically also provided with the IC reset signal and the clock signal, in order to disregard the initial interval of N cycles after reset or initialization, during which the shift register output legitimately deviates from the expected pattern.

In response to detecting a deviation from the expected pattern, detector 48 typically triggers a fault alert. The IC protection circuitry may take various actions in response to a fault alert, such as shut down portions of the IC, erase certain data from the IC, issue an external alert, or any other suitable action.

Figure 2:
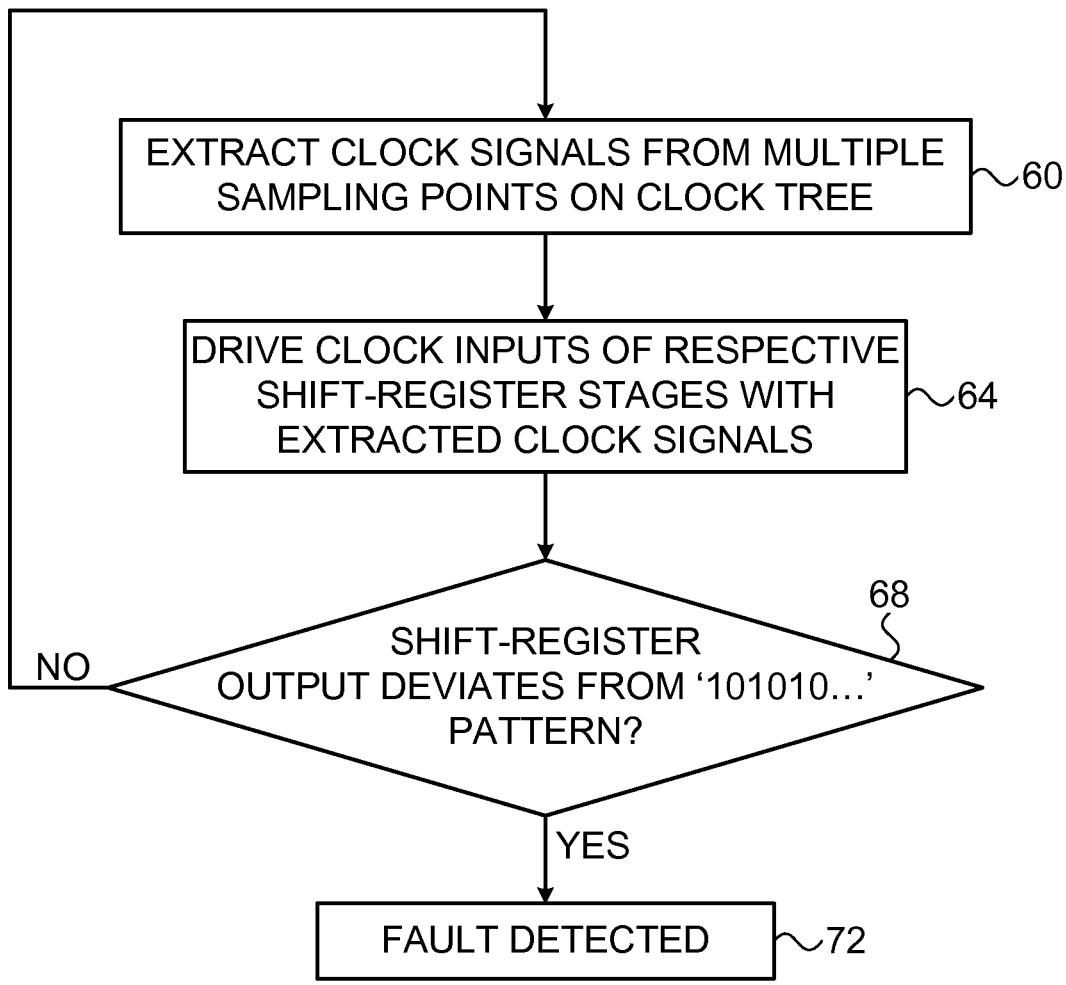
FIG. 2 is a flow chart that schematically illustrates a method for clock-tree fault protection, in accordance with an embodiment of the present invention.

FIG. 2 is a flow chart that schematically illustrates a method for clock-tree fault protection, in accordance with an embodiment of the present invention. The method begins with extracting multiple clock signal instances from multiple sampling points on clock tree 24, at a clock sampling step 60. The extracted clock signal instances drive the clock inputs of respective FF stages 52 of shift register 44, at a clocking step 64.

Detector 48 checks whether the output of shift register 44 deviates from the expected "10101010 . . . " pattern, at a checking step 68. If not, the method loops back to step 60 above. If a deviation is found, detector 48 issues a fault alert, at a fault detection step 72.

Reset-Tree Fault Protection

Additionally or alternatively to the clock tree, IC 20 may comprise reset-tree circuitry (also referred to as "reset tree" for brevity) that distributes a reset signal from a reset source to various hardware units across the IC. The reset-tree circuitry typically comprises circuit traces that span large portions of the IC, as well as active components such as buffers and/or inverters. In some cases, the reset tree may also be subject to fault attacks as well as innocent fault events.

In some embodiments, the protection circuitry in IC 20 protects against fault attacks and other faults in the reset tree, either instead of or in addition to protection of the clock tree. Additionally or alternatively, the configuration described below can be used for protecting other static signals, typically high-fanout signals, such as a test scan shift enable signal.

Figure 3:
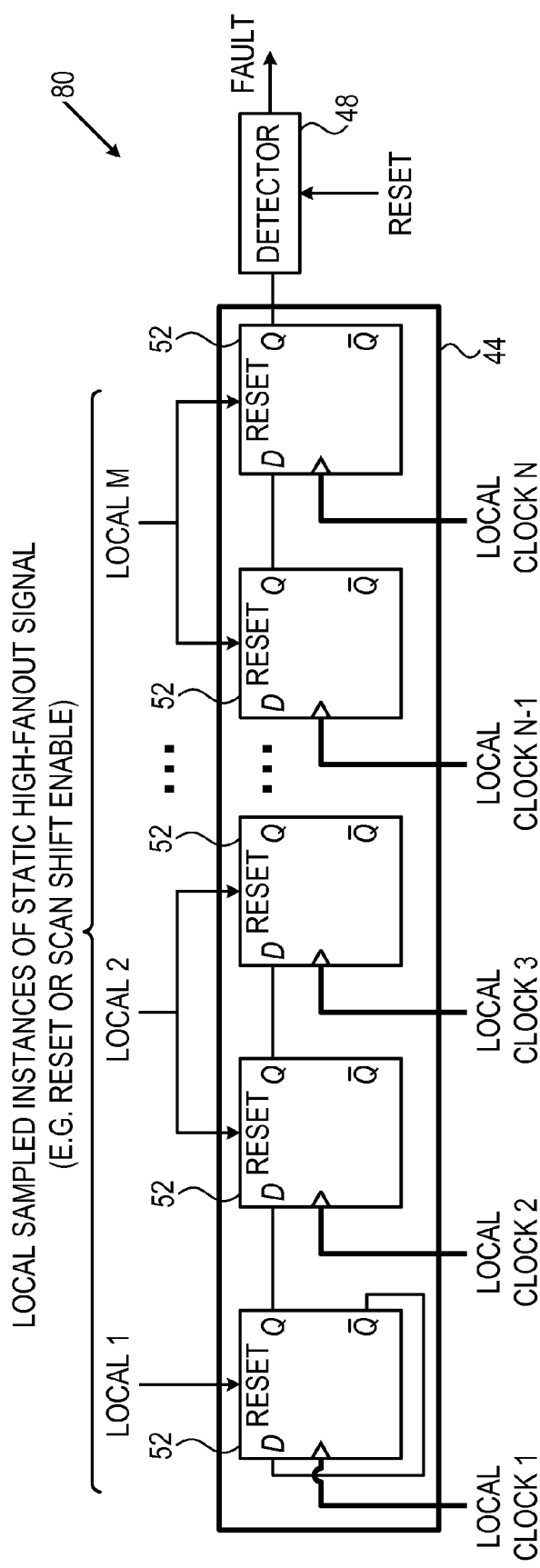
FIGS. 3 and 4 are block diagrams that schematically illustrate reset-tree and clock-tree protection circuitry, in accordance with alternative embodiments of the present invention.

FIG. 3 is a block diagram that schematically illustrates reset-tree and clock-tree protection circuitry 80, in accordance with an alternative embodiment of the present invention. Protection circuitry 80 comprises shift register 44 of cascaded FF stages 52, and a detector 48, similarly to the protection circuitry of FIG. 1 above. As in FIG. 1, FF stages 52 are clocked by respective instances of the clock tree, and detector detects faults in the clock tree by detecting deviations from the expected alternating "10101010..." pattern at the cascade output.

In addition, the "RESET" inputs of FF stages 52 are driven by respective instances of a static high-fanout signal to be protected, which are sampled at multiple sampling points on the high-fanout signal tree. These instances are referred to as "LOCAL 1"... "LOCAL M" in the figure. The signal in question may comprise, for example, a reset signal, a test scan shift enable signal, or any other suitable static signal. The description that follows refers mainly to reset-tree protection, purely by way of example. Alternatively to the "RESET" inputs of FFs 52, the local sampled instances of the signal may be connected to the "SET" inputs of the FFs after inversion.

Under normal circumstances, the reset signal is typically asserted only during power-up of the IC, and then released. If any of the instances of the reset signal (LOCAL 1-LOCAL M) is asserted during normal operation of the protection circuitry, the alternating "1010101010 . . . " pattern at the cascade output will be distorted, and the deviation detected by detector 48.

In the embodiment of FIG. 3, each reset-signal instance (except the first one) drives a pair of successive FF stages 52. The rationale behind this scheme is that, because of the alternating "1010101010..." pattern, at any given time one of the FF stages in the pair holds a "1" value and the other holds a "0" value. Since the reset-signal instance is connected to both FF stages, it is ensured that one of them will detect the abnormality.

Protection circuitry 80 of FIG. 3 protects both the clock tree and the reset tree. Alternatively, however, a similar scheme can be used for protecting only the reset tree. In such a scheme, FF stages 52 are all clocked by some suitable clock signal, not necessarily by different instances of the clock signal sampled at different sampling points.

Alternative Clock-Tree and/or Reset-Tree Fault Protection Scheme

Figure 4:
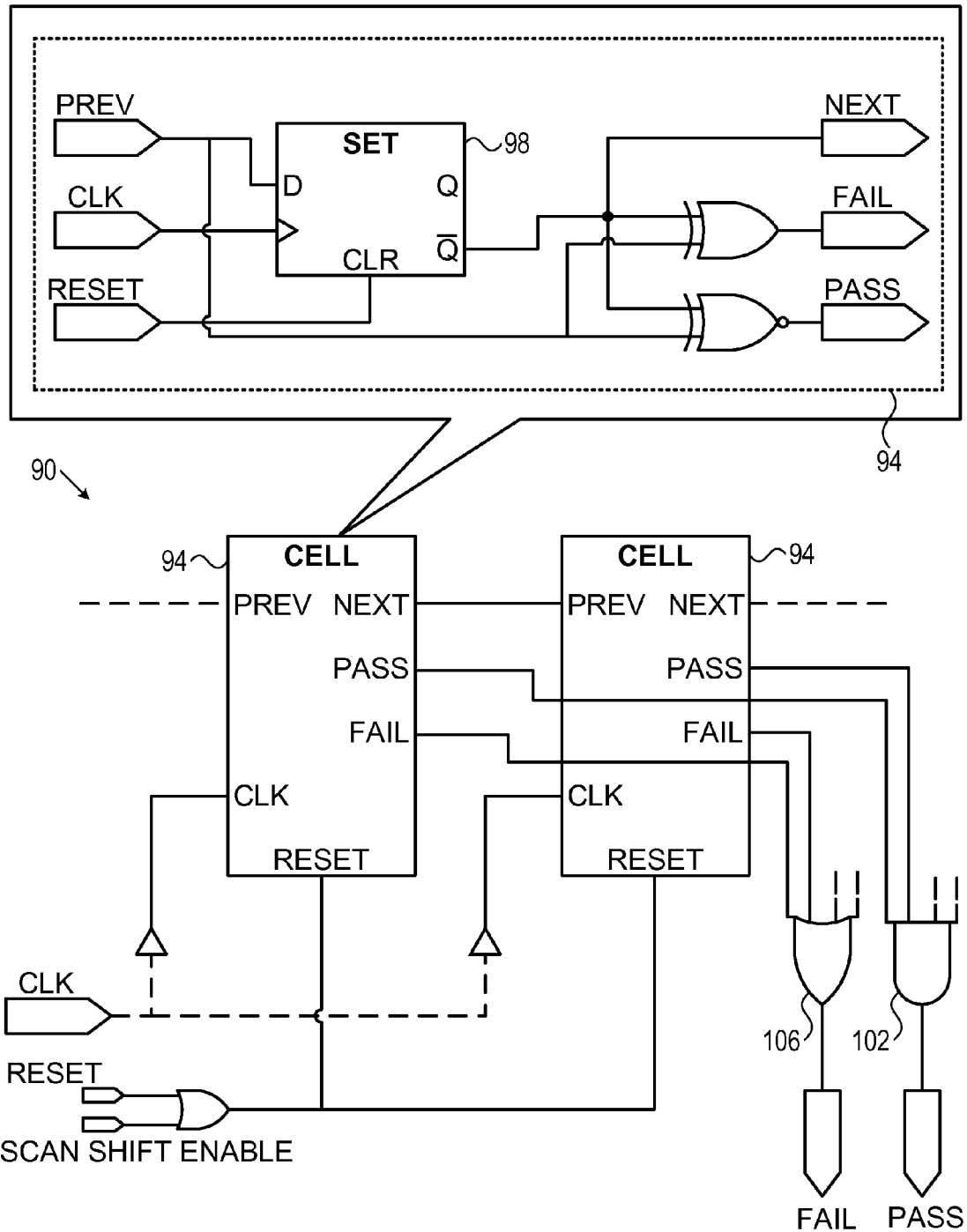

FIG. 4 is a block diagram that schematically illustrates reset-tree and clock-tree protection circuitry 90, in accordance with yet another embodiment of the present invention. In this embodiment, too, the protection circuitry comprises a cascade of logic stages. In the present example, however, each logic stage comprises a cell 94 that comprises a FF 98.

The cascade of cells 94 is cyclic. In other words, cells 94 are connected in a ring, with the output of each cell connected to the input of the next cell. In this scheme all cells have the same symmetrical role. In each cell 94, the inverted output of FF 98 is used as the "NEXT" signal produced the cell, which is connected to the "PREV" input of the next cell in the cascade.

FF 98 in each cell is clocked by a respective instance of the clock signal sampled at a respective sampling point on the clock tree. The CLR input of FF 98 in each cell is reset by a respective instance of the reset signal sampled at a respective sampling point on the reset tree.

Each cell outputs two outputs denoted "PASS" and "FAIL". The "PASS" output is set if the output of the cell is equal to the output of the previous cell. The "FAIL" output is set in the opposite case, i.e., if the output of the cell is different from the output of the previous cell.

The "PASS" outputs of the various cells in the cascade are aggregated by aggregation logic 102. The aggregated output of logic 102 (typically AND logic) is set if and only if all cells set their "PASS" outputs. The "FAIL" outputs of the various cells in the cascade are aggregated by aggregation logic 106. The aggregated output of logic 106 (typically OR logic) is set if any of the cells set its "FAIL" output. The "PASS" and "FAIL" logic is redundant, in the sense that it may be sufficient to use only one type of output (e.g., only "PASS" or only "FAIL"). In alternative embodiments, only one type of output (e.g., only "PASS" or only "FAIL") is indeed used.

Unlike the configurations of FIGS. 1 and 3, in protection circuitry 90 of FIG. 4 there is no expected alternating pattern, and no initial time period during which the cascade has to initialize. Under normal circumstances, all FFs 98 are initialized at reset. From this point, all FFs 98 hold the same value at any given time, and all FFs 98 alternate together between "0" and "1" on every clock cycle.

In the event of fault attack (or other fault) in the clock or reset tree, one or more of FFs 98 will typically hold a value that is different from the other FFs. In such a case, the "FAIL" output of logic 106 will be true, and the "PASS" output of logic 102 will be false.

Protection circuitry 90 of FIG. 4 protects both the clock tree and the reset tree. Alternatively, however, a similar scheme can be used for protecting only the reset tree. In such a scheme, FF stages 98 are all clocked by some suitable clock signal, not by different instances of the clock signal sampled at different sampling points. Further alternatively, a similar scheme can be used for protecting only the clock tree. In such a scheme, FF stages 98 are all driven by the same reset signal, not by different instances of the reset signal sampled at different sampling points.

The embodiments described in FIGS. 1-4 above refer mainly to protection of clock and/or reset signals. Generally, however, the disclosed techniques can be used in a similar manner for protecting any other suitable high-fanout signal that is distributed across the IC. One additional example of a high-fanout signal is a scan test shift enable signal that is not expected to be active during normal operation.

The IC and protection circuitry configurations shown in FIGS. 1, 3 and 4 are example configurations that are depicted purely for the sake of conceptual clarity. In alternative embodiments, any other suitable IC and/or protection circuitry configuration can be used. For example, In the examples above the logic stages are connected in a cascade. In alternative embodiments, the logic stages may be interconnected to drive one another in accordance with any suitable topology, e.g., in a tree or mesh topology.

As another example, the protection circuitry may comprise any other suitable circuit that is clocked or otherwise driven by multiple instances of a clock signal, a reset signal, a test scan shift enable signal and/or other suitable high-fanout signal. In the schemes of FIGS. 1 and 3, depending on the specific design of the protection circuitry, the expected pattern may have any other suitable format. For example, the pattern may comprise a pseudo-random yet predictable pattern.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An Integrated Circuit (IC), comprising:
   signal distribution circuitry, which is configured to distribute a high-fanout signal across the IC; and
   protection circuitry, which comprises:
      a plurality of logic stages, which comprise "SET" or "RESET" inputs for receiving multiple instances of the signal that are sampled at multiple sampling points in the signal distribution circuitry, wherein the logic stages are configured to be set or reset in response to the multiple instances of the signal, and wherein the logic stages are interconnected to drive one another in a cyclic cascade, in which each logic stage has a respective input and a respective output and the input of each logic stage is driven by the output of a previous logic stage in the cyclic cascade, so as to propagate abnormalities indicative of faults occurring in the signal distribution circuitry; and
      detection circuitry configured to detect a fault in the signal distribution circuitry in response to an abnormality propagating in the plurality of logic stages,
      wherein each logic stage has a respective "PASS" output, which is set if the output of the logic stage is equal to the output of the previous logic stage and is reset if the output of the logic stage differs from the output of the previous logic stage, and wherein the protection circuitry further comprises a "PASS" aggregation logic configured to aggregate respective "PASS" outputs of the logic stages to an aggregated "PASS" output.

2. The IC according to claim 1, wherein at least two successive logic stages in the topology are configured to be set or reset by the same instance of the signal.

3. The IC according to claim 1, wherein the signal comprises at least one signal type selected from a group of types consisting of a clock signal, a reset signal and a test scan shift enable signal.

4. The IC according to claim 1, wherein the plurality of logic stages is configured to output an alternating pattern of logical values, and wherein the detection circuitry is configured to detect the fault by identifying a deviation from the alternating pattern.

5. The IC according to claim 1, wherein the logic stages are configured to alternate between logical values and to all output the same logical value at a given time, and wherein the detection circuitry is configured to detect the fault by identifying a deviation from the same logical value.

6. The IC according to claim 1, wherein the detection circuitry is configured to disregard abnormalities that occur within a predefined interval after initialization.

7. The IC according to claim 1, wherein the protection circuitry is configured to initialize the logic stages so as to initially produce an expected output.

8. The IC according to claim 1, wherein, in response to detecting the fault, the protection circuitry is configured to issue an alert or act upon the detected fault.

9. A method, comprising:
   distributing a high-fanout signal across an Integrated Circuit (IC) using signal distribution circuitry;
   sampling multiple instances of the signal at multiple respective sampling points in the signal distribution circuitry;
   applying the multiple instances of the signal to "SET" or "RESET" inputs of a plurality of logic stages that are interconnected to drive one another in a cyclic cascade, in which each logic stage has a respective input and a respective output and the input of each logic stage is driven by the output of a previous logic stage in the cyclic cascade, so as to set or reset the logic stages in response to the multiple instances of the signal and propagate abnormalities indicative of faults occurring in the signal distribution circuitry; and detecting a fault in the signal distribution circuitry in response to an abnormality propagating in the plurality of logic stages, wherein each logic stage has a respective "PASS" output, which is set if the output of the logic stage is equal to the output of the previous logic stage and is reset if the output of the logic stage differs from the output of the previous logic stage, and wherein detecting the fault comprises aggregating respective "PASS" outputs of the logic stages to an aggregated "PASS" output.

10. The method according to claim 9, wherein setting or resetting the logic stages comprises setting or resetting at least two successive logic stages in the topology by the same instance of the signal.

11. The method according to claim 9, wherein the signal comprises at least one signal type selected from a group of types consisting of a clock signal, a reset signal and a test scan shift enable signal.

12. The method according to claim 9, wherein detecting the fault comprises identifying a deviation from an alternating pattern of logical values at an output of the plurality of logic stages.

13. The method according to claim 9, wherein detecting the fault comprises identifying a deviation from a same logical value that all the logic stages output at a given time.

14. The method according to claim 9, and comprising disregarding abnormalities that occur within a predefined interval after initialization.

15. The method according to claim 9, and comprising initializing the logic stages so as to initially produce an expected output.

16. The method according to claim 9, and comprising, in response to detecting the fault, issuing an alert or acting upon the detected fault.

17. The IC according to claim 1, wherein each logic stage has a respective "FAIL" output, which is reset if the output of the logic stage is equal to the output of the previous logic stage and is set if the output of the logic stage differs from the output of the previous logic stage, and wherein the protection circuitry further comprises a "FAIL" aggregation logic configured to aggregate respective "FAIL" outputs of the logic stages to an aggregated "FAIL" output.

18. The method according to claim 9, wherein each logic stage has a respective "FAIL" output, which is reset if the output of the logic stage is equal to the output of the previous logic stage and is set if the output of the logic stage differs from the output of the previous logic stage, and wherein detecting the fault comprises aggregating respective "FAIL" outputs of the logic stages to an aggregated "FAIL" output.

* * * * *